United States Patent
Tsai et al.

(10) Patent No.: US 7,998,775 B2
(45) Date of Patent: Aug. 16, 2011

(54) SILICON UNDERCUT PREVENTION IN SACRIFICIAL OXIDE RELEASE PROCESS AND RESULTING MEMS STRUCTURES

(75) Inventors: Shang-Ying Tsai, Jhongli (TW);
Chun-Ren Cheng, Hsin-Chu (TW);
Jung-Huei Peng, Jhubei (TW);
Jiou-Kang Lee, Zhu-Bei (TW);
Ting-Hau Wu, Yilan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/619,542

(22) Filed: Nov. 16, 2009

(65) Prior Publication Data

US 2010/0203664 A1 Aug. 12, 2010

Related U.S. Application Data

(60) Provisional application No. 61/151,078, filed on Feb. 9, 2009.

(51) Int. Cl.
*H01L 21/30* (2006.01)

(52) U.S. Cl. .................. 438/52; 257/E21.211

(58) Field of Classification Search ............... 438/48–53
See application file for complete search history.

(56) References Cited

U.S. PATENT DOCUMENTS

| | | | | |
|---|---|---|---|---|
| 5,188,983 A * | 2/1993 | Guckel et al. | | 438/53 |
| 5,830,777 A * | 11/1998 | Ishida et al. | | 438/50 |
| 6,127,812 A * | 10/2000 | Ghezzo et al. | | 320/166 |
| 6,734,550 B2 * | 5/2004 | Martin et al. | | 257/704 |
| 6,808,954 B2 * | 10/2004 | Ma et al. | | 438/51 |
| 6,933,165 B2 * | 8/2005 | Musolf et al. | | 438/50 |
| 6,946,315 B2 * | 9/2005 | Ikeda et al. | | 438/52 |
| 7,022,542 B2 * | 4/2006 | Combi et al. | | 438/52 |
| 7,060,522 B2 * | 6/2006 | Gulvin et al. | | 438/53 |
| 7,129,125 B2 * | 10/2006 | Sekine et al. | | 438/197 |
| 7,157,057 B2 * | 1/2007 | Gohil | | 422/123 |
| 7,157,781 B2 * | 1/2007 | Kawasaki et al. | | 257/419 |
| 7,276,698 B2 * | 10/2007 | Tohyama et al. | | 250/338.1 |
| 7,537,958 B1 * | 5/2009 | Joshi | | 438/106 |
| 7,563,635 B2 * | 7/2009 | Ikushima et al. | | 438/55 |
| 7,728,703 B2 * | 6/2010 | Kim et al. | | 333/262 |
| 7,732,241 B2 * | 6/2010 | Yamaguchi et al. | | 438/52 |
| 7,736,929 B1 * | 6/2010 | Monadgemi et al. | | 438/51 |
| 2002/0096018 A1 * | 7/2002 | Rodgers et al. | | 81/3.33 |
| 2003/0153116 A1 * | 8/2003 | Carley et al. | | 438/53 |
| 2004/0053434 A1 * | 3/2004 | Bruner | | 438/52 |
| 2006/0270201 A1 * | 11/2006 | Chua et al. | | 438/481 |
| 2007/0172975 A1 * | 7/2007 | Tomomatsu et al. | | 438/52 |
| 2007/0298534 A1 * | 12/2007 | Ikushima et al. | | 438/57 |
| 2008/0164237 A1 * | 7/2008 | Kawakubo et al. | | 216/17 |
| 2008/0248604 A1 * | 10/2008 | Christenson et al. | | 438/52 |
| 2008/0308919 A1 * | 12/2008 | Obata et al. | | 257/678 |
| 2010/0001355 A1 * | 1/2010 | Peczalski et al. | | 257/415 |

OTHER PUBLICATIONS

Gianchandani et al, "A MEMs First fabication Process for Integrating CMOS circuits With Polysilcion Microostrcutures" 0-7803-4412/98C 1998 IEEE.*

* cited by examiner

*Primary Examiner* — Savitri Mulpuri
(74) *Attorney, Agent, or Firm* — Slater & Matsil, L.L.P.

(57) ABSTRACT

When a native oxide grows on a polysilicon member of, e.g., a MEMS device, delamination between the polysilicon member and subsequently formed layers may occur because the native oxide is undercut during removal of sacrificial oxide layers. Nitriding the native oxide increases the etch selectivity relative the sacrificial oxide layers. Undercutting and delamination is hence reduced or eliminated altogether.

14 Claims, 4 Drawing Sheets

SILICON UNDERCUT PREVENTION IN SACRIFICIAL OXIDE RELEASE PROCESS AND RESULTING MEMS STRUCTURES

This application claims the benefit of U.S. Provisional Patent Application Ser. No. 61/151,078, filed on Feb. 9, 2009, and entitled "Silicon Undercut Prevention in Sacrificial Oxide Release Process and Resulting MEMS Structures," which application is incorporated herein by reference.

TECHNICAL FIELD

This invention relates to MEMS structures and methods of forming same, and more particularly to an improved process for removing a sacrificial layer, such as an oxide layer, during formation of a MEMS device.

BACKGROUND

MEMS devices are becoming increasingly prevalent as new and additional applications are developed employing MEMS technology. In many applications, it is important that the manufacturing processes for forming the MEMS structure is compatible with integrated circuit manufacturing processes, particularly CMOS manufacturing processes. This is particularly so as, in many applications, MEMS devices are formed simultaneously with formation of CMOS devices, or at least formed on the substrate as CMOS devices.

The use of a polysilicon structure in the formation of MEMS devices is well known. The tendency of a native oxide to grow on polysilicon structures is also well known. Such native oxides can have deleterious effects, such as delamination of layers formed atop the polysilicon structure from the polysilicon structure. This delamination may arise, for example, because the native oxide between the polysilicon structure and the overlying layer can be partially etched or undercut during other oxide etches, resulting in weak interface between the two.

Special clean processes and strict control on queue time have been proposed to remove any native oxide or to limit the time in which a native oxide can form. These approaches may be impractical from the perspective of the additional costs and loading of equipment in a manufacturing environment. Other proposed approaches have involved formation of special additional layers to reduce or eliminate the formation of a native oxide. The approaches are also unsatisfactory from the perspective of costs and additional complexity. What is needed, then, is a practical, low-cost solution to the problems associated with formation of native oxides on polysilicon features of a MEMS device.

SUMMARY OF THE INVENTION

These and other problems are generally solved or circumvented, and technical advantages are generally achieved, by preferred embodiments of the present invention.

In accordance with a preferred embodiment of the present invention, a method for manufacturing an electronic device comprises forming a first patterned sacrificial oxide layer atop a substrate and forming a first patterned polysilicon layer atop the first patterned sacrificial oxide layer. The method further comprises forming a second patterned sacrificial oxide layer atop the first patterned polysilicon layer and forming a second patterned polysilicon layer atop the second patterned sacrificial oxide layer, wherein a native oxide forms on the second patterned polysilicon layer. The method further includes nitriding the native oxide to convert the native oxide to SiON, forming a silicon nitride layer atop the SiON, and removing the patterned first and second sacrificial oxide layers.

In accordance with another preferred embodiment of the present invention, a method for forming a MEMS device having a cantilevered polysilicon feature comprises forming a first polysilicon feature atop a first sacrificial oxide layer, forming a second sacrificial oxide layer atop the first polysilicon feature, and forming a second polysilicon feature atop the second sacrificial oxide layer. The method further includes subjecting the second polysilicon feature to a nitridation step wherein a native oxide on the second polysilicon feature is converted to a nitrogen containing material, forming a rigid layer atop the second polysilicon feature, and removing the first and second sacrificial oxide layers.

In accordance with yet another preferred embodiment of the present invention, a MEMS device comprises a substrate having a trench formed therein, and a first conductive feature cantilevered over the trench. A second conductive feature is over the first conductive feature and separated therefrom by an air gap. The second conductive feature comprises a polysilicon layer and a rigid layer and a nitride containing oxide layer interposed between the polysilicon layer and the rigid layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
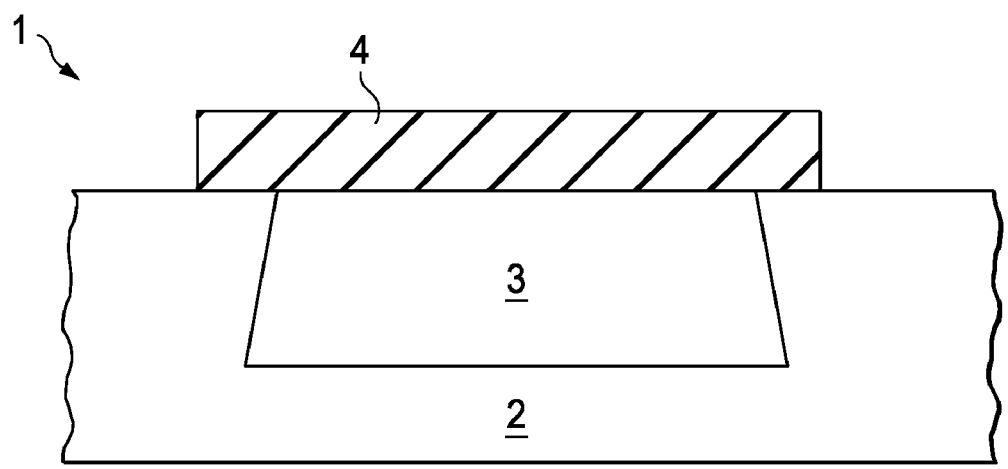
FIGS. 1a-1e illustrate an intermediate state of manufacture for an illustrative MEMS device in which aspects of the present invention may be practiced.

With reference to FIG. 1a, an intermediate stage of manufacture of an illustrative MEMS device 1 is illustrated. Substrate 2 has had formed therein a trench 3. Trench 3 is formed using conventional processes and is filled with a sacrificial trench fill material (not shown) such as silicon oxide or the like. This sacrificial trench fill material will be subsequently removed, as will be apparent to those skilled in the art. A first sacrificial layer 4 is formed and patterned over substrate 2. First sacrificial layer 4 could be formed of, e.g., an oxide layer using well known deposition techniques, such as chemical vapor deposition (CVD), or possibly thermally grown, or using some other conventional technique. In an illustrative embodiment, first sacrificial oxide film is formed to be about 0.5-3μ thick.

Figure 1B:
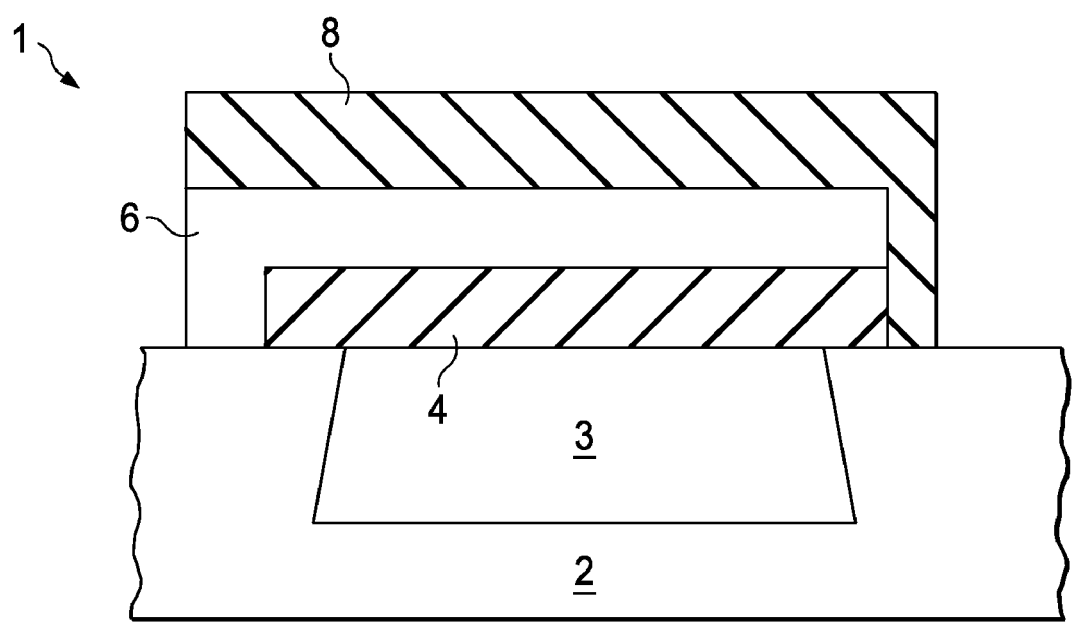

As illustrated in FIG. 1b, first polysilicon layer 6 is next formed, such as by a low pressure CVD (LPCVD) or epitaxial growth process, over substrate 2 and patterned first sacrificial oxide layer 4. First polysilicon layer 6 can be formed to any desired thickness depending upon the ultimate application for the MEMS device. In an illustrative embodiment, first polysilicon layer 6 is formed to a thickness that will allow for desired flexibility, such as from about 1μ to about 5μ. First polysilicon layer 6 is then patterned using known photolithographic techniques, although other patterning techniques are within the contemplated scope of the present invention.

A second sacrificial layer 8 is formed atop patterned first polysilicon layer 6 and substrate 2. Again, second sacrificial layer 8 could be an oxide or similar material; a CVD or other conventional processes could be employed to form second sacrificial layer 8 to whatever thickness is desired. In an illustrated embodiment, second sacrificial layer 8 may be formed to about 4μ. To the extent that a native oxide formed on first polysilicon layer 6, such native oxide would be subsumed within subsequently formed second sacrificial layer 8, assuming same to be an oxide, and would have no affect on subsequent processes. Second sacrificial layer 8 is then patterned using conventional processes.

Figure 1C:
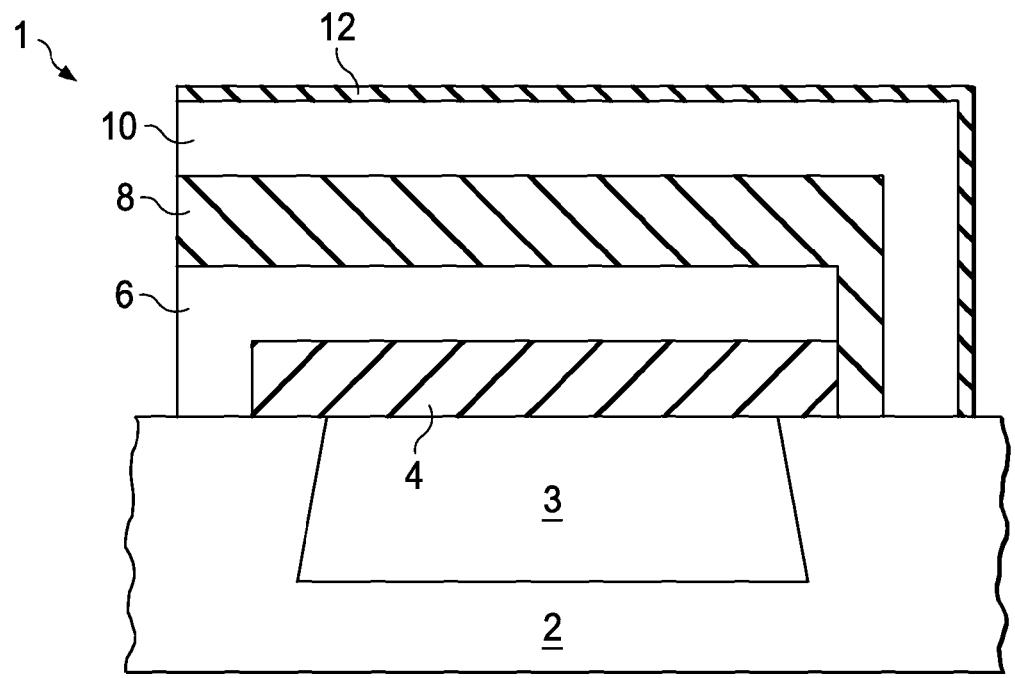

Second polysilicon layer 10 is formed atop patterned second sacrificial layer 8 using, e.g., an LPCVD or epitaxial process or other conventional approach to forming a polysilicon layer. This is illustrated in FIG. 1c. Second polysilicon layer 10 is also patterned through photolithographic or other patterning techniques. As shown in FIG. 1c, a thin native oxide 12 forms on second polysilicon layer 10. While not a desired feature, native oxide layer 12 is an almost inevitable result of the tendency of polysilicon material to oxidize rapidly in the presence of air or other oxygen source. Such a native oxide film will form within minutes of exposure, although typically to only a few Angstroms, perhaps up to about ten Angstroms thickness, under normal circumstances.

Both first polysilicon layer 6 and second polysilicon layer 10 may be doped with impurity to increase the layers respective conductivity. Such doping is preferably performed in situ meaning the dopant is introduced into the respective polysilicon layers during the formation process, as is known in the art. Alternatively, dopant could be introduced into the layers using an ion implantation process subsequent to formation of the respective polysilicon layers. In either event one or both of the polysilicon layers 6 and 10 are doped in the illustrative embodiments.

Figure 1D:
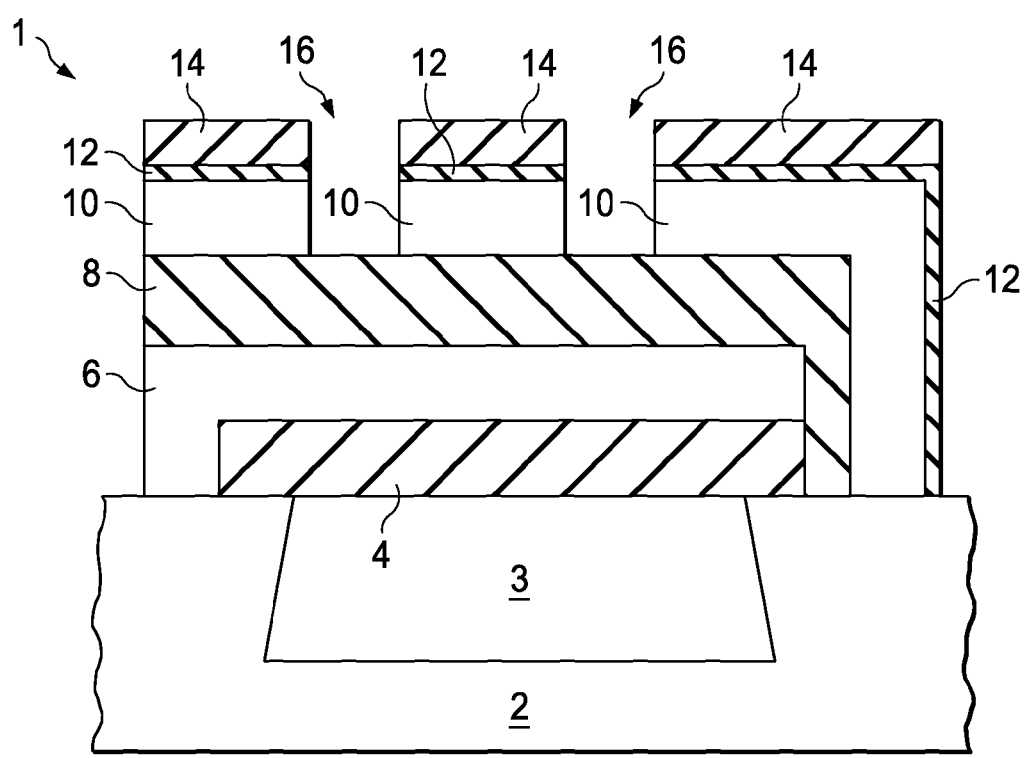

FIG. 1d illustrates silicon nitride layer 14 formed atop patterned second polysilicon layer 10. Silicon nitride layer provides support and rigidity to second polysilicon layer 10. Other materials, such as SiC, SiCN, or the like could alternatively be used, provided they offer sufficient rigidity and structural support to second polysilicon layer 10. Silicon nitride layer 14 can be formed using conventional techniques such as a thermal nitride deposition, physical vapor deposition (PVD), CVD, or the like. In common parlance, silicon nitride layer 14 is formed on second polysilicon layer 10, although as shown in FIG. 1d, silicon nitride layer 14 is actually separated from second polysilicon layer 10 by native oxide layer 12. As will be addressed in more detail below, the presence of intervening native oxide layer 12 may weaken the interface between silicon nitride layer 14 and second polysilicon layer 10, possibly causing delamination between these layers.

Using known patterning techniques, openings 16 are formed through silicon nitride layer 14 and second polysilicon layer 10. For instance, a photoresist layer (not shown) may be formed and patterned atop silicon nitride layer 14, followed by an anisotropic dry etch to remove exposed portions of silicon nitride layer 14 and second polysilicon layer 10.

Figure 1E:
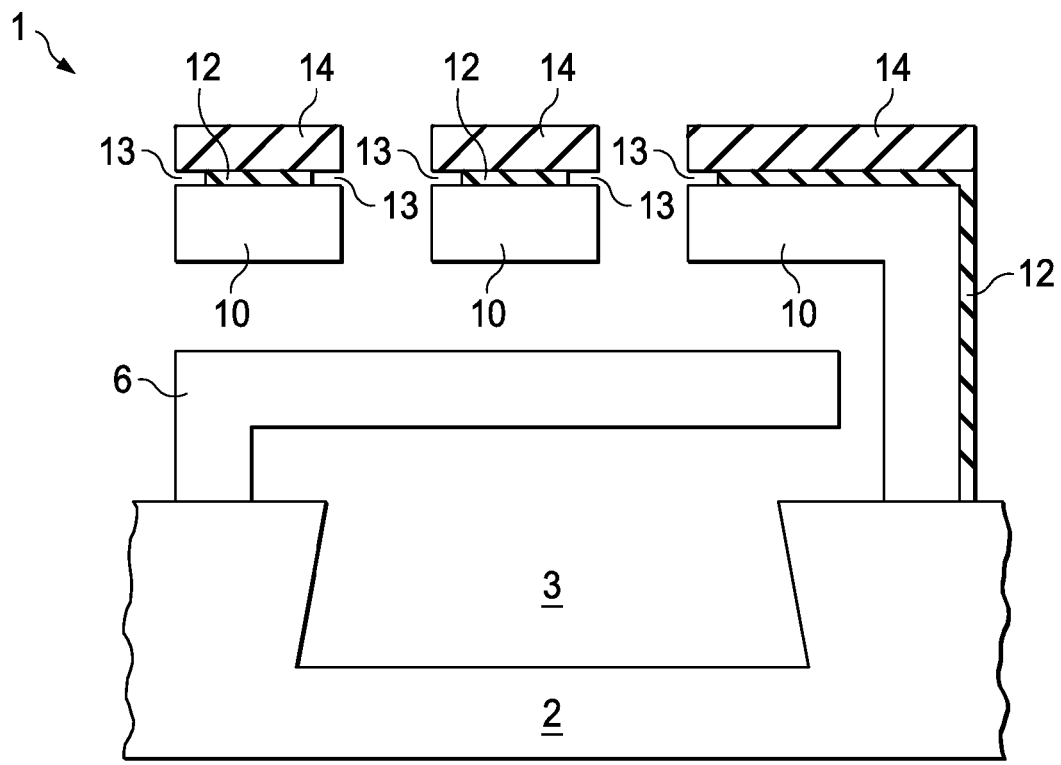

Next, second sacrificial layer 8 and first sacrificial layer 4 are removed to allow first polysilicon layer 6 to freely cantilever over trench 3, as shown in FIG. 1e. Second sacrificial layer 8 and first sacrificial layer 4 are preferably removed by using a wet etch dip in HF or a vapor HF etch process. These processes are well known and understood in removing oxide layers. As shown in FIG. 1e, native oxide layer 12 is also at least partially removed during the process of removing the sacrificial oxide layers. This results in undercut features 13 between second polysilicon layer 10 and overlying silicon nitride layer 14, which may allow for delamination between second polysilicon layer 10 and overlying silicon nitride layer 14.

Figure 2:
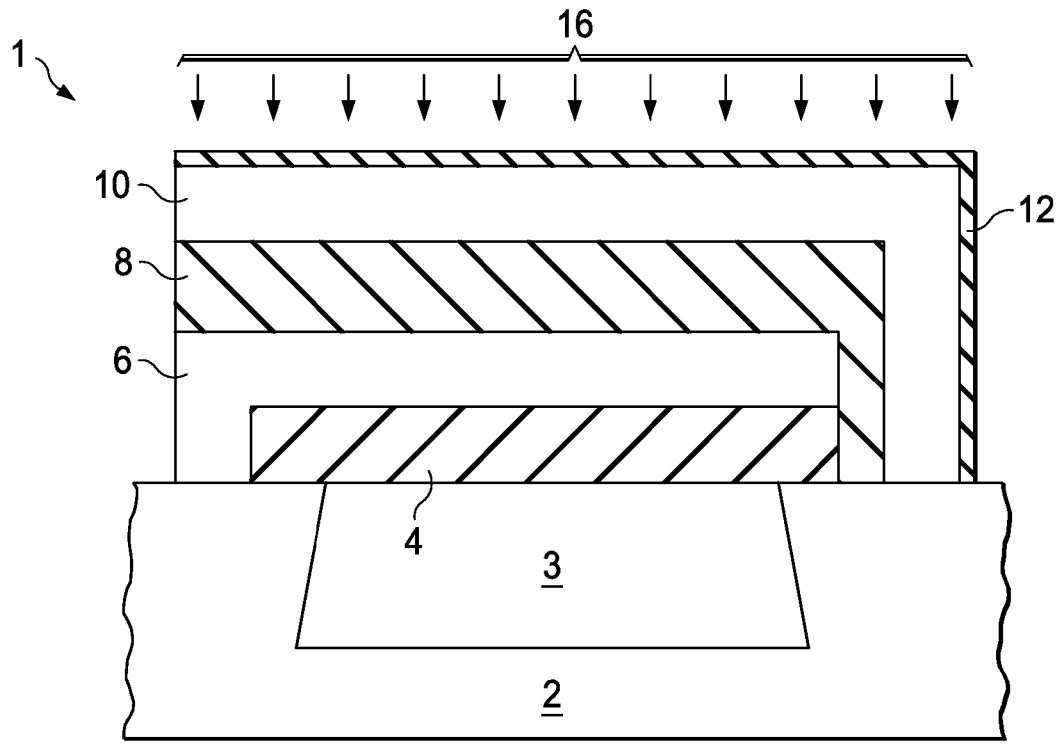
FIG. 2 illustrates the deleterious effects that may arise from the formation of a native oxide on a polysilicon feature of a MEMS device.

With reference now to FIG. 2 a method to reduce the risk of delamination arising from native oxide layer 12 will be described in greater detail. FIG. 2 illustrates MEMS device 1 at the same intermediate stage of manufacture as illustrated in FIG. 1c. As described above with reference to FIG. 1c, second polysilicon layer 10 is formed and patterned and native oxide layer 12 forms on exposed surfaces of second polysilicon layer 10. In an illustrative embodiment of the present invention, native oxide layer 12 is subjected to a nitriding step, schematically illustrated by reference numeral 16 in FIG. 2. This nitriding step converts native oxide layer 12 to a nitrided oxide such as SiON. This nitriding step can be accomplished in a furnace nitridation step, through plasma nitriding, through a rapid thermal nitridation process, or other such technique.

For example, in one illustrative embodiment, native oxide layer 12 is nitrided in an LPCVD tool, exposing MEMS device 1 and hence native oxide layer 12 to an ammonia atmosphere within the LPCVD tool. An exemplary process may include a temperature of from about 600 to about 1200 C, in an atmosphere containing $N_2$, $NH_3$, or the like for a duration of about 60 to about 3600 seconds. Alternatively, native oxide layer 12 could be exposed to a nitrogen containing plasma in a plasma reactor. In other embodiments, native oxide layer 12 could be nitrided through a rapid thermal nitridation process by exposing the layer to a nitrogen containing atmosphere at a high temperature for a short duration, as is known in the art. Regardless of the approach employed, care should be taken to carefully control the thermal budget allowed for processing of the device, particularly when the polysilicon layers are doped with impurities, which can diffuse during subsequent thermal processes. In some embodiments, the nitriding step 16 could be accomplished in situ, meaning in the same chamber in which silicon nitride layer 14 is deposited, such as in an LPCVD tool. It is believed that the higher the concentration of nitrogen in the resulting SiON film, the greater the desired etch selectivity can be achieved. Hence, it is particularly advantageous if the resulting SiON film, having a formulation of $Si_xO_yN_z$, has a ratio of N to Si and O is above a stochiometric ratio.

Figure 3:
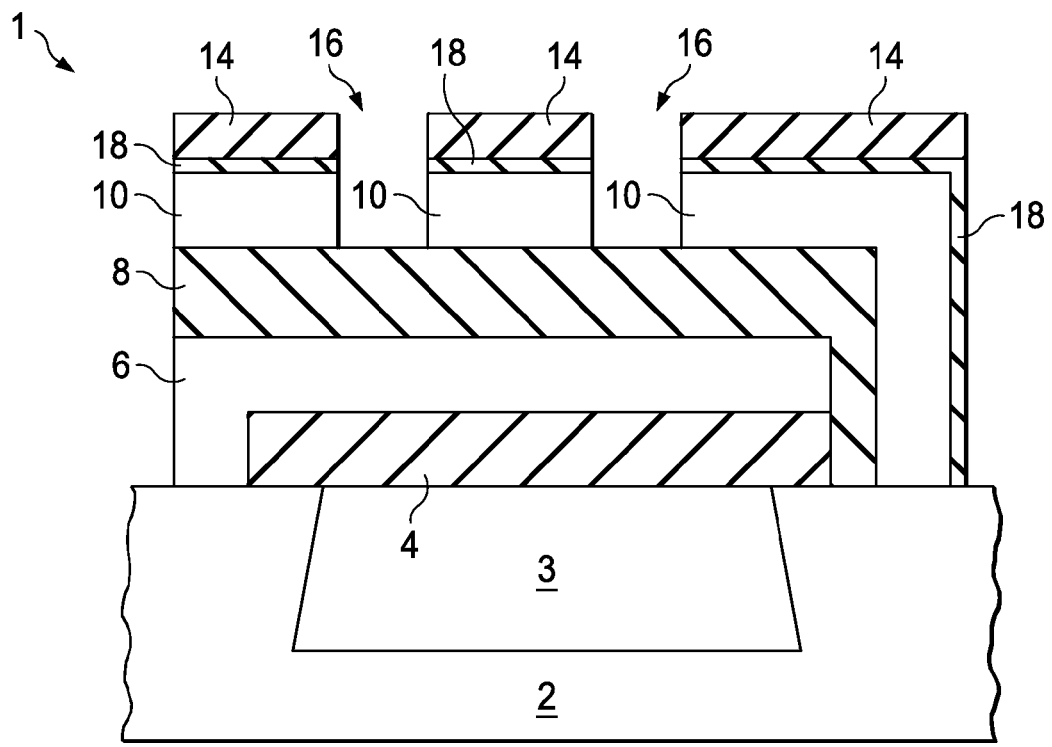
FIG. 3 illustrates an exemplary nitriding process embodiment of the present invention.
Figure 4:
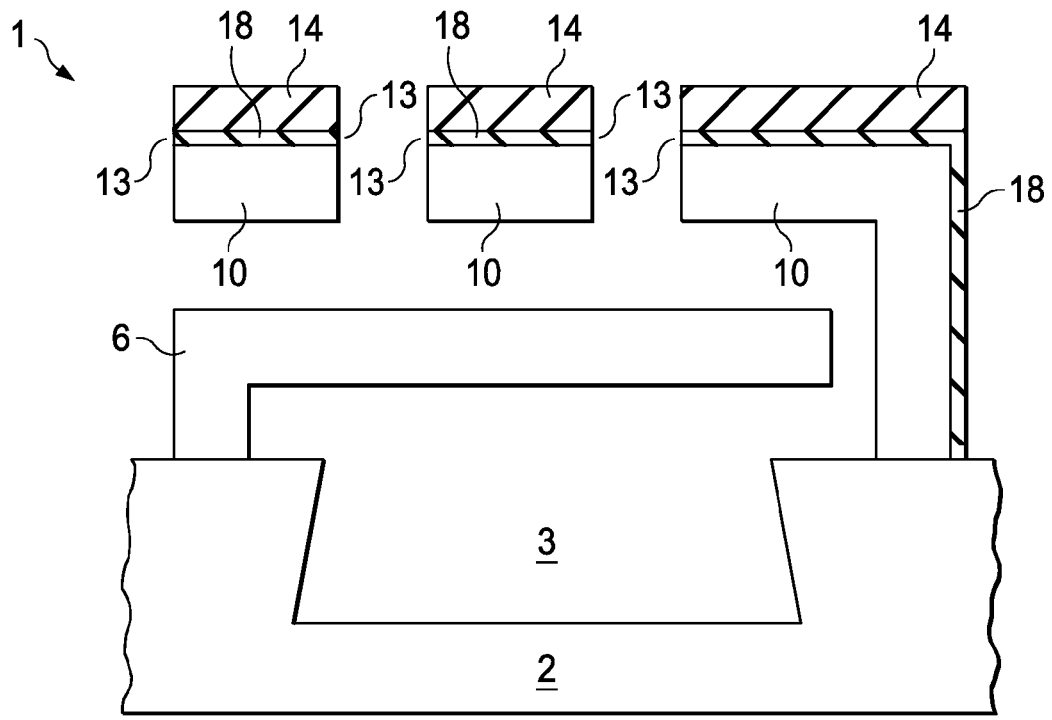
FIG. 4 illustrates a preferred embodiment MEMs device.

After the nitridation step, native oxide layer 12 is converted to SiON layer 18, as shown in FIG. 3. FIG. 3 also illustrates MEMS device 1 after silicon nitride layer 14 is formed atop SiON layer 18, and hence FIG. 3 corresponds to the stage of manufacture for MEMS device 1 illustrated in FIG. 1d. FIG. 4, which corresponds to FIG. 1e, illustrates MEMS device 1 after second sacrificial layer 8 and first sacrificial layer 4 have been removed as described above. Note that SiON layer 18 remains essentially intact. This is because SiON has a much high etch selectivity to HF and other oxide silicon etch recipes, meaning that SiON is attacked or removed much slower than SiO during the removal of sacrificial oxides. For this reason, SiON layer 18 remains relatively intact and undercut features 13 are avoided. Hence, the risk of delamination between silicon nitride layer 14 and second polysilicon layer 10 is greatly reduced or eliminated altogether.

As shown in FIG. 4, after first and second sacrificial layers 4 and 8 are removed, first polysilicon layer 6 is cantilevered over trench 3 and is free to move freely relative second polysilicon layer 10. One skilled in the art will recognize that by appropriately contacting first and second polysilicon layers 6 and 10, respectively, the capacitive value between these features can be read as the features move relative one another. In this way, the mechanical motion of first polysilicon layer 6 can be converted to an electrical signal. A MEMS microphone, or gyro could be readily implemented from the illustrated structure. In another embodiment, an MEMS RF tuning device could be implemented from the illustrated structure.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing an electronic device comprising:
    forming a trench in the substrate and filling the trench with sacrificial trench fill material;
    forming a first patterned sacrificial layer atop a substrate;
    forming a first patterned polysilicon layer atop the first patterned sacrificial layer;
    forming a second patterned sacrificial layer atop the first patterned polysilicon layer;
    forming a second patterned polysilicon layer atop the second patterned sacrificial layer, wherein a native oxide forms on the second patterned polysilicon layer;
    nitriding the native oxide to convert the native oxide to SiON;
    forming a support layer atop the SiON; and
    removing the patterned first and second sacrificial layers and removing sacrificial trench fill material from within the trench.

2. The method of claim 1 wherein nitriding the native oxide comprises a process selected from the group consisting of a nitride plasma process, a rapid thermal nitridation process, or a furnace nitridation process.

3. The method of claim 1 wherein removing the patterned first and second sacrificial layers comprises exposing the patterned first and second sacrificial layers to an HF solution or an HF vapor.

4. The method of claim 1 further including doping at least one of the patterned first polysilicon layer and the patterned second polysilicon layer with an impurity.

5. The method of claim 4 wherein the doping comprises an in situ doping.

6. The method of claim 1 wherein at least one of the patterned first and second sacrificial layers is formed by a CVD process.

7. The method of claim 1 further comprising etching an opening in the support layer and the patterned second polysilicon layer to expose the patterned second sacrificial layer.

8. A method of forming a MEMS device having a cantilevered polysilicon feature comprising:
    forming a trench in a substrate;
    filling the trench with a fill material;
    forming a first sacrificial material on the substrate and over the fill material;
    forming a first conductive element atop the first sacrificial layer;
    forming a second sacrificial layer covering the first conductive element;
    forming a second conductive element atop the second sacrificial layer;
    subjecting the second conductive element to a treatment wherein a native oxide on the second conductive element is converted to a second material;
    forming a rigid layer atop the second conductive element; and
    removing the first and second sacrificial layers and removing fill material from the trench.

9. The method of claim 8 wherein the native oxide is converted to SiON.

10. The method of claim 8 wherein subjecting the second conductive element to a treatment step comprises exposing the second conductive element to a nitrogen containing ambient or a nitrogen containing plasma at an elevated temperature.

11. The method of claim 9 wherein the nitrogen containing material comprises $Si_xO_yN_z$ and the ratio of N to Si and O is above a stochiometric ratio.

12. The method of claim 8 wherein forming a rigid layer atop the second conductive element comprises depositing a silicon nitride film.

13. The method of claim 12 wherein depositing a silicon nitride film comprises a deposition process selected from the group consisting of a nitride plasma process, a rapid thermal nitridation process, or a furnace nitridation process.

14. The method of claim 8 further comprising doping at least one of the first and second conductive elements with an impurity.

* * * * *